United States Patent
Lee et al.

(10) Patent No.: US 9,903,911 B2
(45) Date of Patent: Feb. 27, 2018

(54) TEST SETTING CIRCUIT, SEMICONDUCTOR DEVICE, AND TEST SETTING METHOD

(71) Applicant: SK hynix Inc., Gyeonggi-do (KR)

(72) Inventors: Jae-Seung Lee, Gyeonggi-do (KR); Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 132 days.

(21) Appl. No.: 14/689,944

(22) Filed: Apr. 17, 2015

(65) Prior Publication Data

US 2016/0139203 A1    May 19, 2016

(30) Foreign Application Priority Data

Nov. 18, 2014 (KR) .................. 10-2014-0160864

(51) Int. Cl.
*G01R 31/00*   (2006.01)
*G01R 31/317*   (2006.01)
(Continued)

(52) U.S. Cl.
CPC ... *G01R 31/31701* (2013.01); *G01R 31/2601* (2013.01); *G01R 31/2607* (2013.01); *G01R 31/2851* (2013.01); *G01R 31/31703* (2013.01)

(58) Field of Classification Search
CPC .............. G01R 31/31701; G01R 31/26; G01R 31/2601; G01R 31/2607; G01R 31/2637; G01R 31/2644; G01R 31/27; G01R 31/28; G01R 31/2801; G01R 31/2803; G01R 31/2806; G01R 31/2818; G01R 31/282; G01R 31/2832; G01R 31/2851; G01R 31/2884; G01R 31/2896; G01R 31/316; G01R 31/3167; G01R 31/317; G01R 31/31703; G01R 31/31712; G01R 31/31713; G01R 31/31722; G01R 31/31723; G01R 31/31724; G01R 31/3187; G01R 31/319; G01R 31/31903; G01R 31/31905; G01R 31/31908; G01R 31/31912; G01R 31/31915; G06F 11/22; G06F 11/2205; G06F 11/2733
See application file for complete search history.

(56) References Cited

U.S. PATENT DOCUMENTS

| | | | | |
|---|---|---|---|---|
| 5,596,537 A | * | 1/1997 | Sukegawa | G11C 29/46 365/201 |
| 6,005,814 A | * | 12/1999 | Mulholland | G01R 31/31701 365/189.05 |
| 2002/0069026 A1 | * | 6/2002 | Endo | G01R 31/31701 702/117 |

FOREIGN PATENT DOCUMENTS

| KR | 1020040003562 | 1/2004 |
|---|---|---|
| KR | 100691008 | 3/2007 |

* cited by examiner

*Primary Examiner* — Bryce Bonzo
*Assistant Examiner* — Anthony J Amoroso
(74) *Attorney, Agent, or Firm* — IP & T Group LLP

(57) ABSTRACT

A test setting circuit includes a first detection unit suitable for detecting whether a first code is sequentially inputted based on a first sequence, at each of first to Nth steps, where N is a natural number; a second detection unit suitable for sequentially receiving a second code through the first to Nth steps, and detecting whether the second code that is sequentially inputted through the first to Nth steps has a value corresponding to a second sequence; and a test setting unit suitable for setting a test mode when it is detected that the first code and the second code are inputted to satisfy the first sequence and the second sequence.

28 Claims, 4 Drawing Sheets

(51) Int. Cl.
*G01R 31/26* (2014.01)
*G01R 31/28* (2006.01)

TEST SETTING CIRCUIT, SEMICONDUCTOR DEVICE, AND TEST SETTING METHOD

CROSS-REFERENCE TO RELATED APPLICATIONS

The present application claims priority of Korean Patent Application No. 10-2014-0160864, filed on Nov. 18, 2014, which is incorporated herein by reference in its entirety.

BACKGROUND

1. Field

Exemplary embodiments of the present invention relate to a test setting circuit, a semiconductor device, and a test setting method.

2. Description of the Related Art

Semiconductor devices include test setting circuits for setting different test modes as well as selecting a variety of testing operations. Semiconductor devices also include test circuits that perform the test operations. When a test operation is selected, a semiconductor device enables a test circuit corresponding to the selected test operation and performs the selected test operation. The test mode is a specific operation mode for performing test operations.

FIG. 1 is a flowchart that describes a conventional test operation.

Referring to FIG. 1, at step S101, setting information (i.e., a command and a code for setting a test mode) may be inputted to the semiconductor device. The command may include a mode register set (MRS) command or test mode register set (TMRS) command. The TMRS command is used for setting the operation environment of the semiconductor device. The code inputted along with the command may include multi-bit information for setting the test mode among various operation modes, and some of the bits of the address may be used as the code. At step S102, the test mode of the semiconductor device may be set when some of the bits of the address are inputted as a preset value together with the command.

For controlling the semiconductor device to perform a specific test operation, a test operation to be performed after the test mode is set must be selected. At step S103, select information is inputted. Various test operations may be set to correspond to specific values of the code. For example, when the semiconductor device may perform first to 16th test operations, the first to 16th test operations may correspond to the values of a four-bit code, that is, '0000' to '1111', respectively. The code inputted to select a test operation may have one value among the values of '0000' to '1111'. When the code is inputted, a test operation corresponding to the value of the input code may be selected and performed, at step S104.

However, when the semiconductor device performs a test operation or normal operation, addresses (i.e., codes) having various values may be consecutively inputted to the semiconductor device. In this case, a test mode of the semiconductor device may be incorrectly set, or a test operation may be incorrectly selected.

SUMMARY

Various embodiments are directed to a test setting circuit that may prevent a test mode from being incorrectly set and a test operation from being incorrectly selected, and a semiconductor device and a test setting method.

In addition, various embodiments are directed to a test setting circuit that may select a resolution (or complexity) of a code reception process for setting a test mode and for selecting a test operation, and a semiconductor device and a test setting method.

In an embodiment, a test setting circuit may include: a first detection unit suitable for detecting whether a first code is sequentially inputted based on a first sequence, at each of first to Nth steps, where N is a natural number; a second detection unit suitable for sequentially receiving a second code through the first to Nth steps, and detecting whether the second code that is sequentially inputted through the first to Nth steps has a value corresponding to a second sequence; and a test setting unit suitable for setting a test mode when it is detected that the first code and the second code are inputted to satisfy the first sequence and the second sequence.

In an embodiment, a semiconductor device may include: a command input unit suitable for receiving a command; an address input unit suitable for receiving an address; a first detection unit suitable for detecting whether a first code is sequentially inputted based on a first sequence, at each of first to Nth steps, wherein N is a natural number, and the first code includes two or more first bits among a plurality of bits forming the address; a second detection unit suitable for sequentially receiving a second code through the first to Nth steps, and detecting whether the second code that is sequentially inputted through the first to Nth steps has a value corresponding to a second sequence, wherein the second code includes two or more second bits among the bits forming the address; a test setting unit suitable for setting a test mode when it is detected that the first code and the second code are inputted to satisfy the first sequence and the second sequence; and a test performing unit suitable for performing a test operation corresponding to a value of the second code sequentially outputted from the test setting unit, among a plurality of test operations.

In an embodiment, a test setting circuit may include: a first detection unit suitable for detecting whether a first code is sequentially inputted based on a first sequence, at each of first to Nth steps, where N is a natural number; a second detection unit suitable for sequentially receiving a second code through the first to Nth steps, and detecting whether the second code that is sequentially inputted through the first to Nth steps has a value corresponding to a second sequence; and a test setting unit suitable for setting a test mode, in a first mode, when the first code is inputted to satisfy the first sequence, and setting the test mode, in a second mode, when the first code and the second code are inputted to satisfy the first sequence and the second sequence.

In an embodiment, a test setting method may include: performing first to Nth detection steps, wherein N is a natural number and, when a first code is sequentially inputted based on a first sequence at a corresponding detection step and a second code is inputted to have a value satisfying a second sequence, the method proceeds to the next step; setting a test mode when the first code is inputted based on the first sequence, at each of first to Nth detection steps and the second code that is sequentially inputted through the first to Nth detection steps has a value corresponding to the second sequence; and selecting one test operation corresponding to a value of the second code among a plurality of test operations when the test mode is set.

DETAILED DESCRIPTION

Figure 1:
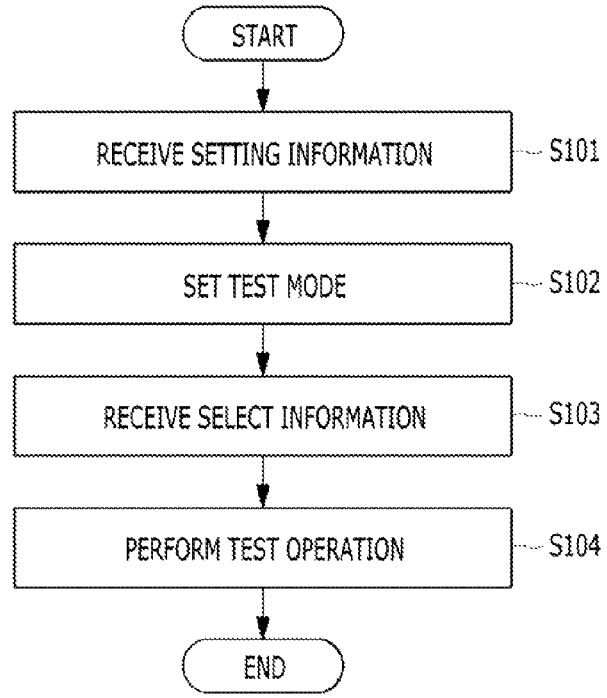
FIG. 1 is a flowchart for describing a conventional test operation.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention. The drawings are not necessarily to scale and, in some instances, proportions may have been exaggerated in order to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
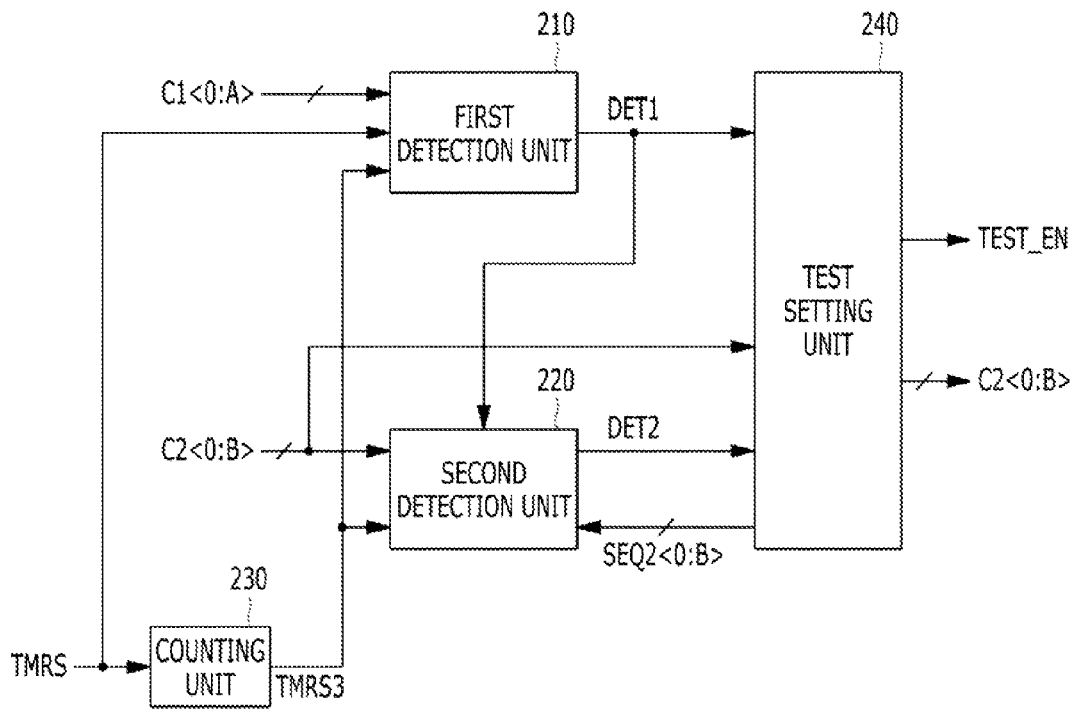
FIG. 2 is a block diagram illustrating a test setting circuit in accordance with an embodiment of the present invention.

FIG. 2 is a block diagram illustrating a test setting circuit in accordance with an embodiment of the present invention.

Referring to FIG. 2, the test setting circuit may include a first detection unit 210, a second detection unit 220, a counting unit 230, and a test setting unit 240. Hereafter, an example in which the test setting circuit receives a first code C1<0:A> and a second code C2<0:B> and sets a test mode at first to third steps will be described as follows. Furthermore, it is assumed that the first code C1<0:A> is inputted three times at each of the first to third steps.

The number of steps through which the test setting circuit sets a test mode and the number of inputs of the first codes C1<0:A> at the respective steps may vary depending on design. As the number of steps through which the test setting circuit sets a test mode and the number of inputs of first codes C1<0:A> at the respective steps are increased, the probability for incorrectly setting a test mode may be reduced.

The counting unit 230 may count applications of a test setting command TMRS, and activate an operation signal TMRS3 when the test setting command TMRS is applied a predetermined number of times (e.g., three times). The counting unit 230 may be reset when the operation signal TMRS3 is activated, for example, when the applications of the test setting command TMRS is counted three times.

The first detection unit 210 may store the first code C1<0:A> received whenever the test setting command TMRS is applied. Furthermore, when the operation signal TMRS3 is activated, the first detection unit 210 may detect whether the first code C1<0:A> is sequentially inputted according to a first sequence at a current step, based on the stored value, and generate a first detection signal DET1. The first detection unit 210 may activate the first detection signal DET1 when it is detected that the first code C1<0:A> is sequentially inputted according to the first sequence, and deactivate the first detection signal DET1 when it is detected that the first code C1<0:A> is sequentially inputted according to a sequence other than the first sequence. The first detection unit 210 may be reset when the first detection signal DET1 is activated, that is, all of the stored value is removed.

The first sequence may indicate a condition of values which the first code C1<0:A> needs to have according to an input sequence, when the first code C1<0:A> is inputted two or more times. For example, when the first sequence is (K1, K2, K3) where K1 to K3 are natural numbers, it may indicate that the first code C1<0:A>, inputted for the first time while the first code C1<0:A> is inputted three times, is K1, the first code C1<0:A> inputted for the second time is K2, and the first code C1<0:A> inputted for the third time is K3. When the value of the first code C1<0:A>, inputted while the first code C1<0:A> is inputted three times, are K1, K2, and K3, it may indicate that the first code C1<0:A> is sequentially inputted according to the first sequence. Otherwise, it may indicate that the first code C1<0:A> is sequentially inputted according to a sequence other than the first sequence.

When a code is P, where P is a natural number, it may indicate that a binary value represented by the corresponding code corresponds to a decimal value of P. For example, when the first code C1<0:A> includes three bits and is '110', the value of the first code C1<0:A> may correspond to '6'.

The second detection unit 220 may receive the second code C2<0:B> when the operation signal TMRS3 is activated, and generate a second detection signal DET2 by detecting whether the second code C2<0:B> has a value corresponding to a second sequence at a current step. The second detection unit 220 may activate the second detection signal DET2 when the second code C2<0:B> has a value corresponding to the second sequence, and deactivate the second detection signal DET2 when the second code C2<0:B> has a value other than the value corresponding to the second sequence.

The second detection unit 220 may generate the second detection signal DET2 by comparing the second code C2<0:B> to second sequence information SEQ2<0:B> when the operation signal TMRS3 is activated while the first detection signal DET1 is activated. The second detection unit 220 may activate the second detection signal DET2 when the second code C2<0:B> is equal to the second sequence information SEQ<0:B>, and deactivate the second detection signal DET2 when the second code C2<0:B> is different than the second sequence information SEQ<0:B>. The second sequence information SEQ2<0:B> may be generated by the test setting unit 240, and have a value corresponding to the second sequence through the first to third steps.

The second sequence may indicate a condition of values which the second code C2<0:B> needs to have through the first to third steps. For example, when the second sequence is (L1, L2, L3) where L1 to L3 are natural numbers, it may indicate that the second code C2<0:B> inputted at the first step is L1, the second code C2<0:B> inputted at the second step is L2, and the second code C2<0:B> inputted at the third step is L3, while the second code C2<0:B> is inputted once at each of the first to third steps. When the value of the second code C2<0:B> inputted through the first to third steps are L1, L2, and L3, it may indicate that the second code C2<0:B> is sequentially inputted according to the second sequence. Otherwise, it may indicate that the second code C2<0:B> is sequentially inputted according to a sequence other than the second sequence. Thus, the second sequence information SEQ2<0:B> at the first step may be set to L1, the second sequence information SEQ2<0:B> at the second step may be set to L2, and the second sequence information SEQ2<0:B> at the third step may be set to L3.

The test setting unit 240 may set a test mode when the first code C1<0:A> is sequentially inputted according to the first sequence at each of first to Nth steps (hereafter, N=3) and the second code C2<0:B> is sequentially inputted according to the second sequence through the first to third steps. The test setting unit 240 may output L1 as the second sequence information SEQ2<0:B> at the first step, output L2 as the second sequence information SEQ2<0:B> at the second step, and output L3 as the second sequence information SEQ2<0:B> at the third step.

When the first code C1<0:A> is sequentially inputted according to the first sequence (e.g., K1, K2, K3) and the second code C2<0:B> has a value (e.g., L1) corresponding to the second sequence, at a current step of the first to third steps, the test setting unit 240 may control the procedure to proceed to the next step. Furthermore, when the first code C1<0:A> is sequentially inputted according to a sequence other than the first sequence or the second code C2<0:B> has a value other than the value corresponding to the second sequence, at a current step of the first to third steps, the test setting unit 240 may control the procedure to return to the first step. In this case, the test setting unit 240 may restart the procedure from the first step. When the test mode is set, the test setting unit 240 may activate a test mode signal TEST_EN indicating that the test mode is set.

When the test mode is set, the test setting unit 240 may select a test operation corresponding to the input second code C2<0:B> among a plurality of test operations. When the test mode is set, the test setting unit 240 may output the second code C2<0:B> when the first code C1<0:A> is sequentially inputted according to the first sequence (i.e., the first detection signal DET1 is activated). At this time, the test setting unit 240 may directly output the second code C2<0:B>, or output information obtained by decoding the second code C2<0:B>. When the first code C1<0:A> is sequentially inputted according to a sequence other than the first sequence after the test mode is set, the test setting unit 240 may cancel the corresponding test mode, and restart the procedure from the step of setting a test mode. When the test mode is canceled, the test setting unit 240 may deactivate the test mode signal TEST_EN.

The test setting circuit may receive two different codes through a plurality of steps and set a test mode only when the codes satisfy the first and second sequences. Thus, the test setting circuit may reduce the possibility of incorrectly setting the test mode.

Figure 3:
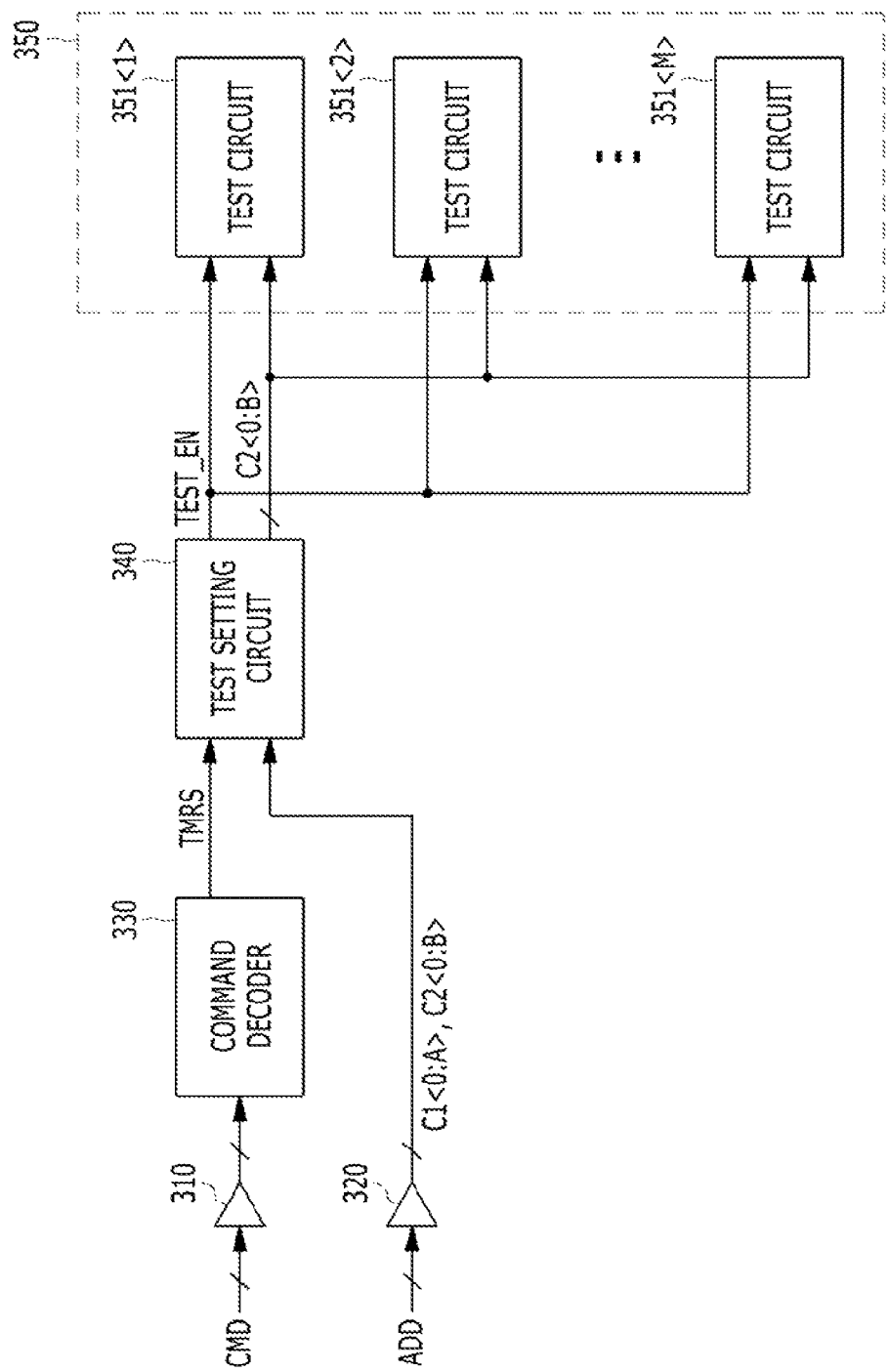
FIG. 3 is a block diagram illustrating a semiconductor device in accordance with an embodiment of the present invention.

FIG. 3 is a block diagram illustrating a semiconductor device in accordance with an embodiment of the present invention.

Referring to FIG. 3, the semiconductor device may include a command input unit 310, an address input unit 320, a command decoder 330, a test setting circuit 340, and a test performing unit 350. The test setting circuit 340 may include the test setting circuit shown in FIG. 2.

The command input unit 310 may receive commands CMDs, and the address input unit 320 may receive addresses ADDs. Each of the commands CMDs and the addresses ADDs may include multi-bit signals.

The command decoder 330 may generate a test setting command TMRS in response to the command signals CMDs inputted through the command input unit 310. The command decoder 330 may activate the test setting command TMRS when a combination of the input command signals CMDs corresponds to the test setting command TMRS. In addition, the command decoder 330 may generate an active, read, or write command by decoding the input command signals CMDs. However, since the commands are not directly related to present invention, illustrations and descriptions thereof are omitted herein.

The test setting circuit 340 may set the test mode for the semiconductor device, and select a test operation which the semiconductor device is to perform among a plurality of test operations. The test setting circuit 340 may receive the first and second codes C1<0:A> and C2<0:B>, in order to set the test mode and select a test operation. The first code C1<0:A> may include one or more first bits among the bits included in the addresses ADDs inputted through the address input unit 320. Furthermore, the second code C2<0:B> may include one or more second bits among the bits included in the addresses ADDs inputted through the address input unit 320.

The test setting circuit 340 may activate the test mode signal TEST_EN and set the test mode for the semiconductor device, as described with reference to FIG. 2. The test performing unit 350 may perform a test operation corresponding to a sequence of inputting the second code C2<0:B> outputted from the test setting circuit 340 in the test mode. When the second code C2<0:B> is sequentially inputted according to a sequence among a plurality of third sequences, the test performing unit 350 may perform a test operation corresponding to the sequence. Furthermore, when the first code C1<0:A> is sequentially inputted according to a sequence other than the first sequence after the test mode is set, the test setting circuit 340 may cancel the corresponding test mode.

The test performing unit 350 may include a plurality of test circuits 351<1:M> which perform a corresponding test operation among the test operations. Each of the test circuits 351<1:M> may correspond to a sequence among the third sequences. When the second code C2<0:B> is sequentially inputted according to the corresponding sequence, the test circuit may be enabled to perform a test operation. For example, when the test circuit 352<2> corresponds to a third sequence (X1, X2, X3) and the second code C2<0:B> is sequentially inputted according to the sequence of X1, X2, and X3 in the test mode, the test circuit 352<2> may be enabled to perform a corresponding test operation.

The semiconductor device may receive two different codes through a plurality of steps, and set the test mode only when the codes satisfy the first and second sequences. Furthermore, the semiconductor device may receive two different codes through a plurality of steps, and select and perform a test operation only when the codes satisfy the first and third sequences. Thus, the semiconductor device may reduce the possibility for incorrectly setting the test mode or for incorrectly selecting a test operation.

Figure 4:
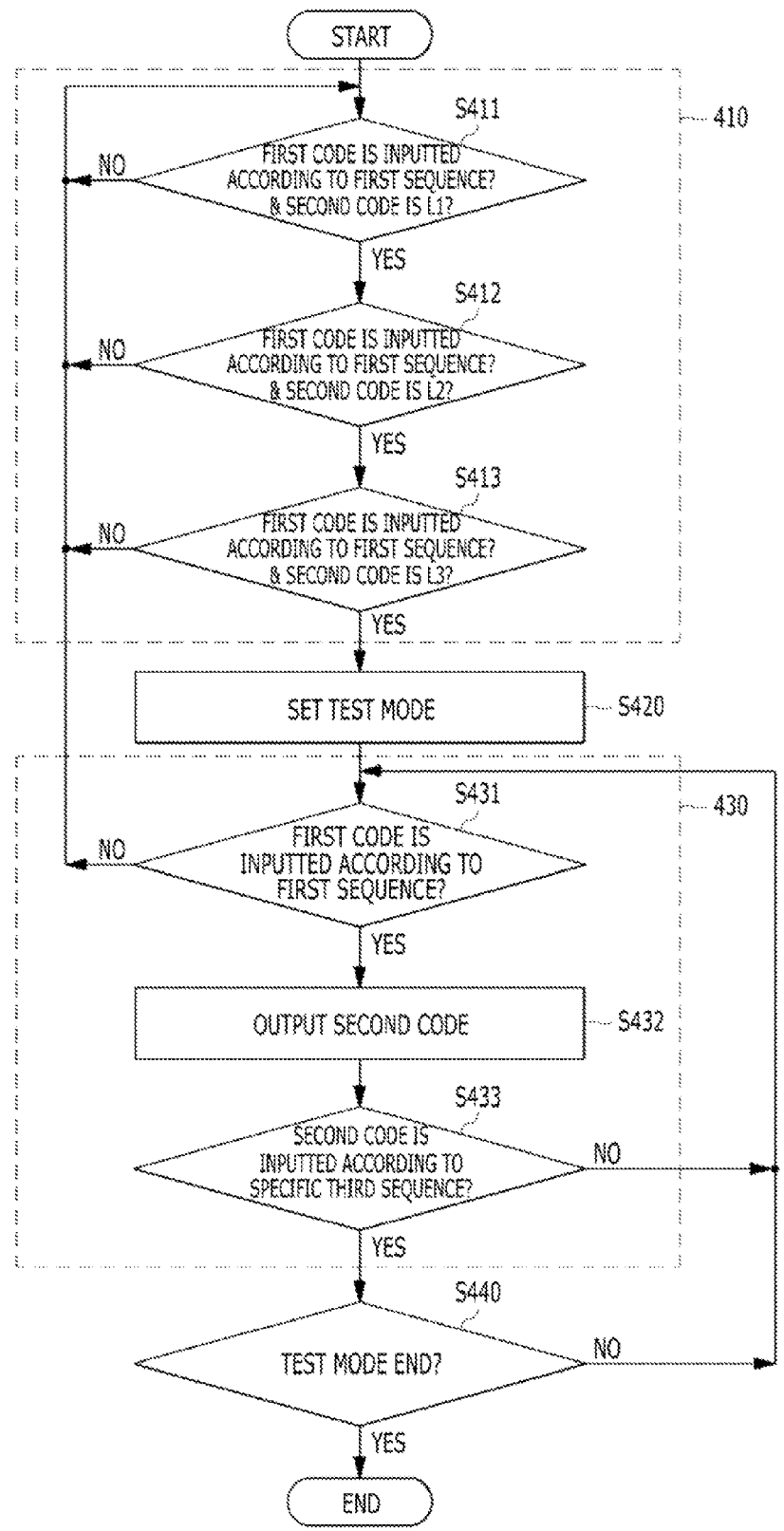
FIG. 4 is a flowchart for describing an operation of the semiconductor device shown in FIG. 3.

FIG. 4 is a flowchart for describing an operation of the semiconductor device shown in FIG. 3. FIG. 4 shows a method in which the semiconductor device sets the test mode and selects a test operation.

Referring to FIG. 4, the operation of the semiconductor device may include a detection step S410, a test mode setting step S420, and a test operation selection step S430. The detection step S410 may include first to Nth detection steps (hereafter, N=3). Thus, the detection step S410 may include first to third detection steps S411 and S413. The test operation selection step S430 may include a detection step S431, an output step S432, and a selection step S433. The test setting command TMRS, the first code C1<0:A>, and the second code C2<0:B> may be periodically applied to the semiconductor device.

The first detection step S411 may be performed to set the test mode after the operation of the semiconductor device is started. When it is detected that the first code C1<0:A> is sequentially inputted according to the first sequence (K1, K2, K3) and the second code C2<0:B> has a value L1 corresponding to the second sequence at the first detection step S411, the procedure may proceed to the second detection step S412. When it is detected that the first code C1<0:A> is sequentially inputted according to a sequence other than the first sequence (K1, K2, K3) or the second code C2<0:B> has a value other than the value L1 corresponding to the second sequence at the first detection step S411, the first detection step S411 may be restarted.

When it is detected that the first code C1<0:A> is sequentially inputted according to the first sequence (K1, K2, K3) and the second code C2<0:B> has a value L2 corresponding to the second sequence at the second detection step S412, the procedure may proceed to the third detection step S413. When it is detected that the first code C1<0:A> is sequentially inputted according to a sequence other than the first sequence (K1, K2, K3) or the second code C2<0:B> has a value other than the value L2 corresponding to the second sequence at the second detection step S412, the first detection step S411 may be restarted.

When it is detected that the first code C1<0:A> is sequentially inputted according to the first sequence (K1, K2, K3) and the second code C2<0:B> has a value L3 corresponding to the second sequence at the third detection step S413, the test mode may be set at step S420. When it is detected that the first code C1<0:A> is sequentially inputted according to a sequence other than the first sequence (K1, K2, K3) or the second code C2<0:B> has a value other than the value L3 corresponding to the second sequence at the third detection step S413, the first detection step S411 may be restarted.

Furthermore, after the test mode is set, the test setting unit 240 shown in FIG. 2 may detect whether the first code C1<0:A> is sequentially inputted according to the first sequence (K1, K2, K3), at the detection step S431. When it is detected that the first code C1<0:A> is sequentially inputted according to the first sequence (K1, K2, K3), the test setting unit 240 may output the input second code C2<0:B> at step S432. When it is detected that the first code C1<0:A> is sequentially inputted according a sequence other than the first sequence (K1, K2, K3), the test setting unit 240 may not output the input second code C2<0:B>. When it is detected that the first code C1<0:A> is sequentially inputted according to a sequence other than the first sequence (K1, K2, K3) after the test mode is set, the test setting unit 240 may cancel the corresponding test mode, and restart the procedure from the detection step S410. Furthermore, when the test mode is canceled at the detection step S431, the test may be restarted from the step S410 of setting the test mode.

At step S433, a test operation is selected. The second code C2<0:B> outputted from the test setting unit 240 may be transmitted to the test circuits 351<1:M>. Each of the test circuits 351<1:M> may be enabled to perform a corresponding test, when it is determined that the second code C2<0:B> is sequentially inputted according to a sequence corresponding to the corresponding test circuit.

At step S440, it is determined whether the test mode ends. When it is determined that the test mode does not end, the detection step S431, the output step S432, and the selection step S433 may be repeated. When it is determined that the test mode ends, the above-described operations may not be repeated, and then the test mode for the semiconductor device may end. In the test setting operation of FIG. 4, the semiconductor device may receive two different codes through a plurality of steps, and set the test mode only when the codes satisfy the first and second sequences. Furthermore, the test setting method may receive two different codes through a plurality of steps, and select and perform a test operation only when the codes satisfy the first sequence and a specific sequence. Thus, the test setting method may reduce the possibility for incorrectly setting the test mode or for incorrectly selecting a test operation.

Figure 5:
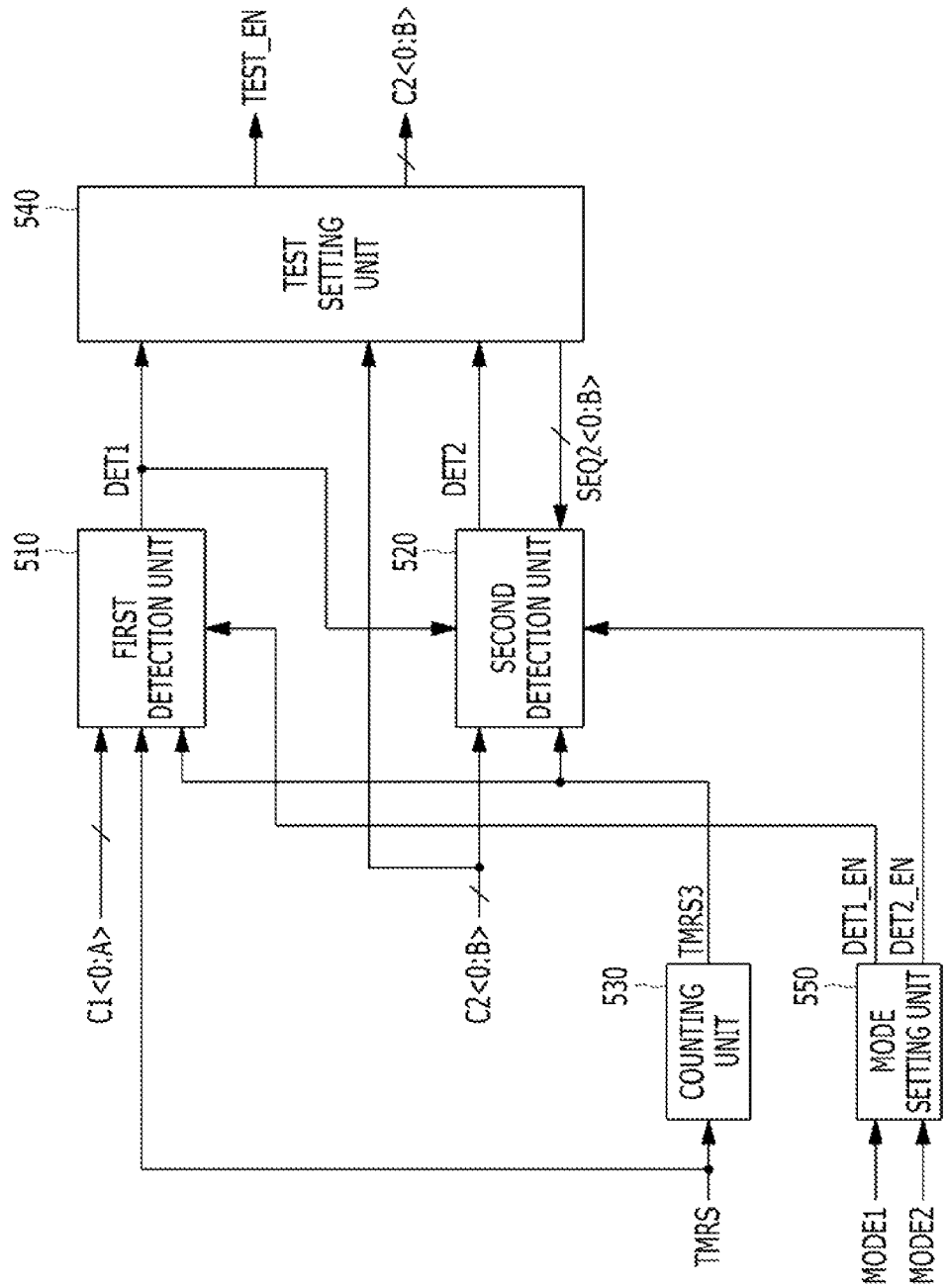
FIG. 5 is a block diagram illustrating a test setting circuit in accordance with an embodiment of the present invention.

FIG. 5 is a block diagram illustrating a test setting circuit in accordance with an embodiment of the present invention.

Referring to FIG. 5, the test setting circuit may include a first detection unit 510, a second detection unit 520, a counting unit 530, a test setting unit 540, and a mode setting unit 550. The test setting circuit shown in FIG. 5 may select a resolution (or complexity) of a code reception process for setting a test mode according to a mode. Hereafter, a first mode may refer to an operation mode in which a resolution of the test mode is set to be relatively high, and a second mode may refer to an operation mode in which a resolution of the test mode is set to be relatively low.

In the first mode, the test setting circuit may receive the first code C1<0:A> and then set the test mode. In the second mode, the test setting circuit may receive the first code C1<0:A> and the second code C2<0:B> and then set the test mode.

The mode setting unit 550 may set the test setting circuit to one operation mode of the first and second modes in response to first and second mode signals MODE1 and MODE2. The mode setting unit 550 may set the test setting circuit to the first mode when the first mode signal MODE1 is activated, and set the test setting circuit to the second mode when the second mode signal MODE2 is activated. The mode setting unit 550 may generate first and second enable signals DET1_EN and DET2_EN. When the first mode signal MODE1 is activated, the mode setting unit 550 may activate the first enable signal DET1_EN and deactivate the second enable signal DET2_EN. When the second mode signal MODE2 is activated, the mode setting unit 550 may activate both of the first and second enable signals DET1_EN and DET2_EN.

The operation of the counting unit 530 may be performed in the same manner as the counting unit 230 shown in FIG. 2. The first detection unit 510 may operate when the first enable signal DET1_EN is activated, and the first detection unit 510 may operate in the same manner as that of the first detection unit 210 shown in FIG. 2. The second detection unit 520 may operate when the second enable signal DET2_EN is activated, and the second detection unit 520 may operate in the same manner as that of the second detection unit 220 shown in FIG. 2.

In the first mode, the test setting unit 540 may set the test mode when the first code C1<0:A> is sequentially inputted according to the first sequence. When the test mode is set, the test setting unit 540 may output the second code C2<0:B>. The output second code C2<0:B> may be transmitted to the test circuits 351<1:M> included in the semiconductor device shown in FIG. 3.

In the second mode, the test setting unit 540 may operate in the same manner as the test setting unit 240 shown in FIG. 2, to set the test mode. For example, when the first code C1<0:A> is sequentially inputted according to the first sequence at each of the first to third steps and the second code C2<0:B> is sequentially inputted according to the second sequence through the first to third steps, the test setting unit 540 may set the test mode. The test setting unit 540 may output L1 as the second sequence information SEQ2<0:B> when the first step is performed, output L2 as the second sequence information SEQ2<0:B> when the second step is performed, and output L3 as the second sequence information SEQ2<0:B> when the third step is performed. Furthermore, when the test mode is set, the test setting unit 540 may output the input second code C2<0:B> while the first code C1<0:A> is sequentially inputted according to the first sequence. The output second code C2<0:B> may be transmitted to the test circuits 351<1:M> included in the semiconductor device shown in FIG. 3. When the first code C1<0:A> is sequentially inputted according to a sequence other than the first sequence after the test mode is set, the test setting unit 540 may cancel the corresponding test mode.

The test setting circuit shown in FIG. 5 may select the complexity for setting the test mode. When the test mode setting is performed through the first mode, the time required for the test mode setting may be reduced. When the test mode setting is performed through the second mode, two different codes may be received through a plurality of steps, and the test mode may be set only when the codes satisfy the first and second sequences. Thus, the embodiments of the present invention may reduce incorrect setting of test modes.

In accordance with the embodiments of the present invention, the test setting circuit, the semiconductor device, and the test setting method may complicate the step at which a code is received to set the test mode and to select a test operation, thereby reducing errors that occur when the test mode is set and a test operation is selected.

Furthermore, the test setting circuit, the semiconductor device, and the test setting method may adjust the complexity of the step at which a code is received to set the test mode and to select a test operation.

Although various embodiments have been described for illustrative purposes, it will be apparent to those skilled in the art that various changes and modifications may be made without departing from the spirit and scope of the invention as defined in the following claims.

What is claimed is:

1. A test setting circuit comprising:
   a first detection unit detecting whether a first code is sequentially inputted based on a first sequence, at each of first to Nth steps, where N is a natural number equal to or greater than 2;
   a second detection unit sequentially receiving a second code through the first to Nth steps, and detecting whether the second code that is sequentially inputted through the first to Nth steps has a value corresponding to a second sequence different from the first sequence; and
   a test setting unit setting a test mode when it is detected that the first code and the second code are inputted to satisfy the first sequence and the second sequence.

2. The test setting circuit of claim 1, wherein, when the first code is inputted based on the first sequence at a current step of the first to Nth steps and the second code corresponding to the current step has a value satisfying the second sequence, the test setting unit proceeds to the next step.

3. The test setting circuit of claim 1, wherein, when the first code is inputted based on a sequence other than the first sequence at a current step of the first to Nth steps or the second code corresponding to the current step has a value not satisfying the second sequence, the test setting unit performs the first step.

4. The test setting circuit of claim 1, wherein the first detection unit sequentially stores the first code inputted at each of the first to Nth steps, and detects whether the first code is inputted based on the first sequence, by using the stored value, when the first code is completely inputted.

5. The test setting circuit of claim 4, wherein, when the first code is inputted based on the first sequence at a current step of the first to Nth steps, the second detection unit detects whether the second code corresponding to the current step has a value satisfying the second sequence.

6. The test setting circuit of claim 1, wherein the test setting unit outputs a value corresponding to a current step of the first to Nth step, among values included in the second sequence.

7. The test setting circuit of claim 1, wherein, after the test mode is set, when it is determined that the first code is inputted based on the first sequence, the test setting unit outputs the second code.

8. The test setting circuit of claim 7, wherein, when the first code is inputted based on a sequence other than the first sequence after the test mode is set, the test setting unit cancels the test mode.

9. The test setting circuit of claim 1, wherein, the first code is inputted two or more times at each of first to Nth steps.

10. A semiconductor device comprising:
    a command input unit receiving a command;
    an address input unit receiving an address;
    a first detection unit detecting whether a first code is sequentially inputted based on a first sequence, at each of first to Nth steps, wherein N is a natural number equal to or greater than 2, and the first code includes two or more first bits among a plurality of bits forming the address;
    a second detection unit sequentially receiving a second code through the first to Nth steps, and detecting whether the second code that is sequentially inputted through the first to Nth steps has a value corresponding to a second sequence different from the first sequence, wherein the second code includes two or more second bits among the bits forming the address;
    a test setting unit setting a test mode when it is detected that the first code and the second code are inputted to satisfy the first sequence and the second sequence; and
    a test performing unit performing a test operation corresponding to a value of the second code sequentially outputted from the test setting unit, among a plurality of test operations.

11. The semiconductor device of claim 10, wherein, when the first code is inputted based on the first sequence at a current step of the first to Nth steps and the second code corresponding to the current step has a value satisfying the second sequence, the test setting unit proceeds to the next step.

12. The semiconductor device of claim 10, wherein, when the first code is inputted based on a sequence other than the first sequence at a current step of the first to Nth steps or the second code corresponding to the current step has a value not satisfying the second sequence, the test setting unit performs the first step.

13. The semiconductor device of claim 10, wherein the first detection unit sequentially stores the first code inputted at each of the first to Nth steps, and detects whether the first code is inputted based on the first sequence, by using the stored value, when the first code is completely inputted.

14. The semiconductor device of claim 13, wherein, when the first code is inputted based on the first sequence at a current step of the first to Nth steps, the second detection unit detects whether the second code corresponding to the current step has a value satisfying the second sequence.

15. The semiconductor device of claim 10, wherein the test setting unit outputs a value corresponding to a current step of the first to Nth step, among values included in the second sequence.

16. The semiconductor device of claim 10, wherein the test performing unit includes a plurality of test circuits each corresponding to one sequence of a plurality of third sequences, and
each of the test circuits is enabled when the second code outputted from the test setting unit is inputted based on a sequence of third sequences, corresponding to the test circuit.

17. The semiconductor device of claim 10, wherein, the first code is inputted two or more times at each of first to Nth steps.

18. A test setting circuit comprising:
a first detection unit detecting whether a first code is sequentially inputted based on a first sequence, at each of first to Nth steps, where N is a natural number equal to or greater than 2;
a second detection unit sequentially receiving a second code through the first to Nth steps, and detecting whether the second code that is sequentially inputted through the first to Nth steps has a value corresponding to a second sequence different from the first sequence; and
a test setting unit setting a test mode, in a first mode, when the first code is inputted to satisfy the first sequence, and setting the test mode, in a second mode, when the first code and the second code are inputted to satisfy the first sequence and the second sequence.

19. The test setting circuit of claim 18, wherein, when the first code is inputted based on the first sequence at a current step of the first to Nth steps and the second code corresponding to the current step has a value satisfying the second sequence, the test setting unit proceeds to the next step.

20. The test setting circuit of claim 18, wherein, in the second mode, when the first code is inputted based on a sequence other than the first sequence at a current step of the first to Nth steps or the second code corresponding to the current step has a value not satisfying the second sequence, the test setting unit performs the first step.

21. The test setting circuit of claim 18, wherein the second detection unit is disabled in the first mode.

22. The test setting circuit of claim 18, wherein, when the test mode is set, the test setting unit, in the first mode, outputs the second code, and the test setting unit, in the second mode, outputs the second code if the first code is inputted to satisfy the first sequence.

23. The test setting circuit of claim 18, wherein, the first code is inputted two or more times at each of first to Nth steps.

24. A test setting method comprising:
performing first to Nth detection steps, wherein N is a natural number equal to or greater than 2 and, when a first code is sequentially inputted based on a first sequence at a corresponding detection step and a second code is inputted to have a value satisfying a second sequence different from the first sequence, the method proceeds to the next step;
setting a test mode when the first code is inputted based on the first sequence, at each of first to Nth detection steps and the second code that is sequentially inputted through the first to Nth detection steps has a value corresponding to the second sequence; and
selecting one test operation corresponding to a value of the second code among a plurality of test operations when the test mode is set.

25. The test setting method of claim 24, wherein, when the first code is inputted based on a sequence other than the first sequence at a current detection step of the first to Nth detection steps or the second code corresponding to the current detection step has a value not satisfying the second sequence, the procedure returns to the first detection step.

26. The test setting method of claim 24, wherein the selecting of the test operation comprises:
outputting the second code when it is detected that the first code is inputted based on the first sequence; and
selecting a test operation corresponding to a value of the output second code, among the test operations.

27. The test setting method of claim 26, further comprising:
canceling the test mode when it is detected that the first code is inputted based on a sequence other than the first sequence.

28. The test setting method of claim 24, wherein, the first code is inputted two or more times.

* * * * *